US009231528B2

(12) United States Patent
Granger-Jones et al.

(10) Patent No.: US 9,231,528 B2
(45) Date of Patent: Jan. 5, 2016

(54) AMPLIFICATION DEVICE HAVING COMPENSATION FOR A LOCAL THERMAL MEMORY EFFECT

(75) Inventors: Marcus Granger-Jones, Scotts Valley, CA (US); Wayne Kennan, Palo Alto, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 660 days.

(21) Appl. No.: 13/049,215

(22) Filed: Mar. 16, 2011

(65) Prior Publication Data

US 2012/0235750 A1 Sep. 20, 2012

(51) Int. Cl.
*H03F 3/04* (2006.01)
*H03F 1/30* (2006.01)

(52) U.S. Cl.
CPC ..................................... *H03F 1/302* (2013.01)

(58) Field of Classification Search
USPC .................. 330/289, 285, 296, 256, 266, 272
See application file for complete search history.

(56) References Cited

U.S. PATENT DOCUMENTS

| | | | | |
|---|---|---|---|---|
| 6,731,171 B2 * | 5/2004 | Yamashita | ..................... | 330/285 |
| 6,946,913 B2 * | 9/2005 | Moriwaki et al. | ............. | 330/296 |
| 7,019,508 B2 * | 3/2006 | Rategh et al. | .................. | 323/314 |
| 7,224,230 B2 * | 5/2007 | Apel et al. | ..................... | 330/289 |
| 7,286,016 B2 * | 10/2007 | Svechtarov et al. | .......... | 330/289 |
| 7,573,336 B2 * | 8/2009 | Ishimaru et al. | .............. | 330/296 |
| 7,768,354 B2 * | 8/2010 | Matsuda et al. | .............. | 330/299 |
| 8,138,836 B2 * | 3/2012 | Matsuzuka et al. | ........... | 330/296 |
| 8,154,345 B2 * | 4/2012 | Andrys et al. | ................. | 330/289 |
| 8,441,320 B2 * | 5/2013 | Signoff et al. | ................ | 330/289 |

OTHER PUBLICATIONS

Boumaiza, S. et al., "Thermal memory effects modeling and compensation in RF power amplifiers and predistortion linearizers," IEEE Transactions on Microwave Theory and Techniques, Dec. 2003, pp. 2427-2433, vol. 51, No. 12, IEEE.
Skadron, K. et al., "Control-theoretic techniques and thermal-RC modeling for accurate and localized dynamic thermal management," Proceedings 2002 Eighth International Symposium on High-Performance Computer Architecture, Feb. 2-6, 2002, pp. 17-28, IEEE.
Van Bezooijen, A. et al., "Biasing Circuits for Voltage Controlled GSM Power Amplifiers," 2003 33rd European Microwave Conference, Oct. 2003, pp. 277-280, IEEE.

(Continued)

*Primary Examiner* — Hieu Nguyen
(74) *Attorney, Agent, or Firm* — Withrow & Terranova, P.L.L.C.

(57) ABSTRACT

In one embodiment, an amplification device has a temperature differential sensing circuit that reduces a local thermal memory effect. The amplification device may include an amplification circuit and biasing circuitry. The amplification device is operable to receive an input signal and generate and amplified output signal. The biasing circuitry generates a biasing signal that sets the quiescent operating level of the amplified output signal. The temperature differential sensing circuit provides a bias level adjustment signal that adjusts the biasing signal to maintain the quiescent operating level of the amplified output signal at a desired level.

20 Claims, 12 Drawing Sheets

(56) References Cited

OTHER PUBLICATIONS

Vuolevi, J. et al., "Cancelling the memory effects in RF power amplifiers," The 2001 IEEE International Symposium on Circuits and Systems, May 6-9, 2001, pp. 57-60, vol. 1, IEEE.

Gonzalez, J.L. et al, "Non-invasive Monitoring of CMOS Power Amplifiers Operating at RF and mm-Wave Frequencies using an On-chip Thermal Sensor," Paper No. RM02D-1 presented at the 2011 IEEE Radio Frequency Integrated Circuits Symposium, Jun. 5-7, 2011, IEEE.

* cited by examiner

AMPLIFICATION DEVICE HAVING COMPENSATION FOR A LOCAL THERMAL MEMORY EFFECT

FIELD OF THE DISCLOSURE

The present disclosure relates to amplification devices and methods of operating amplification devices to compensate for a local thermal memory effect.

BACKGROUND

Many electronic devices include or are connected to amplification devices that amplify input signals and generate amplified output signals. As is well known in the art, these amplification devices may increase or decrease the signal level of the input signal in accordance with a gain. FIG. 1 illustrates a generalized example of a prior art amplification device 10. The amplification device 10 includes an amplification circuit 12 and biasing circuitry 14. The amplification circuit 12 amplifies an input signal 16 and generates an amplified output signal 18. The biasing circuitry 14 generates a biasing signal 20 that may be applied to the input signal 16 to set a bias level and place the input signal 16 within an operating range of the amplification circuit 12. FIG. 2 illustrates the input signal 16 after application of the biasing signal 20. In this example, the input signal 16 and biasing signal 20 are voltage signals and the biasing signal 20 is a DC voltage that provides a DC bias voltage level 22.

In some applications, the signal levels of the input signal 16 are increased and decreased in bursts. As illustrated in FIG. 2, the voltage level of the input signal 16 varies from Viped_h to Viped_l relative to the DC bias voltage level 22 between times t0 to t1 but is increased rapidly to vary between Vimax_h to Vimax_l between times t1 to t2. The input signal 16 may then suddenly decrease once again to vary from Viped_h to Viped_l after time t2.

FIG. 3 illustrates a voltage of the amplified output signal 18 that is output from the amplification circuit 12 as a result of the input signal 18 in FIG. 2. The quiescent operating level of the amplified output signal 18 is the level of the amplified output signal 18 when no input signal 16 is received by the amplification circuit 12. In the amplification device 10, the quiescent operating level is initially set at QI by the DC bias voltage level 22 (shown in FIG. 2) from t0 to t1. Also, the amplified output signal 18 varies from Voped_h to Voped_l from t0 to t1. Ideally, the quiescent operating level of the amplification device 10 remains consistent QI through all of the bursts. However, when a burst in the input signal 16 causes a burst in the amplified output signal 18 at t1, the amplified output signal 18 varies from Vomax_h to Vomax_l and the quiescent operating level of the amplification circuit 12 drifts from QI to QN. This drift in the quiescent operating level prevents the amplified output signal 18 from quickly returning back to varying from between Voped_h to Voped_l at time t2. It is not until time t3 that the quiescent operating level returns to QI.

FIG. 4 illustrates an average power curve 24 of the amplified circuit 12 resulting from the amplification of the input signal 16 in FIG. 2. The power level of power curve 24 is at P_ped between times t0 to t1 but is increased to P_max between times t1 to t2. Section 26 illustrates the ideal behavior of the power curve 24 where the power curve 24 changes almost instantaneously from P_max to P_ped at t2. However, the drift in the quiescent power level from QI to QN (shown in FIG. 3) causes the output signal to instead behave as illustrated in section 28 at time t2. As shown by the section 28, the power curve 24 does not instantaneously change back from P_max to P_ped. Instead, the power curve 24 does not reach P_ped again until time t3.

This drift in the quiescent power level of the amplified output signal from QI to QN may be caused by the heating of components within the amplification circuit 12. FIG. 5 illustrates a more detailed embodiment of the prior art amplification device 10. As shown in FIG. 5, the amplification circuit 12 may include a transistor 30 having a gate terminal that receives the input signal 16 and has been biased to the bias level 22 by the biasing signal 20 from the biasing circuitry 14. In this example, the amplified output signal 18 is the voltage from the collecting terminal to the emitter terminal of the transistor 30. When the input signal 16 bursts to vary from Viped_h to Viped_l to Vimax_h to Vimax_l the transistor 30 begins to heat up. As the transistor 30 heats up, this causes the quiescent operating level to drift from QI to QN because the heating of the transistor 30 causes a decrease in the base-emitter voltage. As a result, the current from the collecting terminal to the emitter terminal of the transistor 30 increases. Thus, the power curve 24 of the amplification circuit 12 (shown in FIG. 3) and the voltage of the amplified output signal 18 (shown in FIG. 4) are held above their respective ideal levels P_ped and QI until the transistor 30 can cool down.

This drift of the quiescent operating level of the amplification circuit 12 may be referred to as a local thermal memory effect. At high output powers the power dissipated by the amplification circuit 12 may cause the temperature of the transistor 30 to rise to be up to be significantly hotter than the temperature of other components in the amplification device 10, such as biasing circuitry 14. Once the output power is reduced, the transistor 30 cools down at a rate dictated by the thermal time-constant of the material it is built on.

FIG. 6 illustrates a temperature 32 of the transistor 30 as the input signal 16 bursts to vary from Viped_h to Viped_l to Vimax_h to Vimax_l (shown in FIG. 2). When the input signal 16 first bursts to vary from Viped_h to Viped_l to Vimax_h to Vimax_l at time t1, the temperature of the transistor 30 increases very quickly. At time t2, when the input signal 16 bursts back to vary between Vimax_h to Vimax_l the temperature of the transistor 30 does not change instantaneously and there is a direct correlation between the temperature 32 of the transistor 30 and the amount of time it takes for the power level 24 (shown in FIG. 4) and voltage (shown in FIG. 3) to return to their respective ideal levels P_ped and QI, respectively.

As response times for electronic devices become increasingly smaller, amplification devices must also provide quicker transitions from one state to another. Often output signals must change in accordance with masking constraints and thus the drift in the quiescent operating level of the amplified output signal can prevent the amplification device from meeting these masking constraints. Thus, what is needed is an amplification device that reduces, compensates, and/or eliminates the thermal memory effect and maintains a more consistent quiescent operating level of the amplified output signal throughout the operation of the amplification device.

SUMMARY

The present disclosure generally relates to amplification devices and methods of amplifying input signals. More specifically, the disclosure relates to amplification devices and methods that reduce, compensate, and/or eliminate a local thermal memory effect of an amplification device. In one embodiment, an amplification device is provided that has an amplification circuit, biasing circuitry, and a temperature differential sensing circuit. The amplification circuit is operable to receive an input signal and generate an amplified output signal. The biasing circuitry is coupled to the amplification circuit and generates a biasing signal. The signal level of the biasing signal provides a bias for the input signal and sets a quiescent operating level of the amplified output signal.

Upon operating the amplification circuit, the amplification circuit may heat up. To reduce, compensate for, or prevent a shift in the quiescent operating level, a temperature differential sensing circuit is provided to detect a temperature difference between a temperature associated with the amplification circuit and a reference temperature. When a temperature difference is detected, a biasing level adjustment signal is generated by the temperature differential sensing circuit. The temperature differential sensing circuit is coupled to the biasing circuitry to provide the biasing level adjustment signal based on the temperature difference between the temperature associated with the amplification circuit and the reference temperature. This adjusts the signal level of the biasing signal and maintains the quiescent operating level of the amplified output signal relatively consistent.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Those skilled in the art will recognize improvements and modifications to the preferred embodiments of the present disclosure. All such improvements and modifications are considered within the scope of the concepts disclosed herein and the claims that follow.

Figure 1:
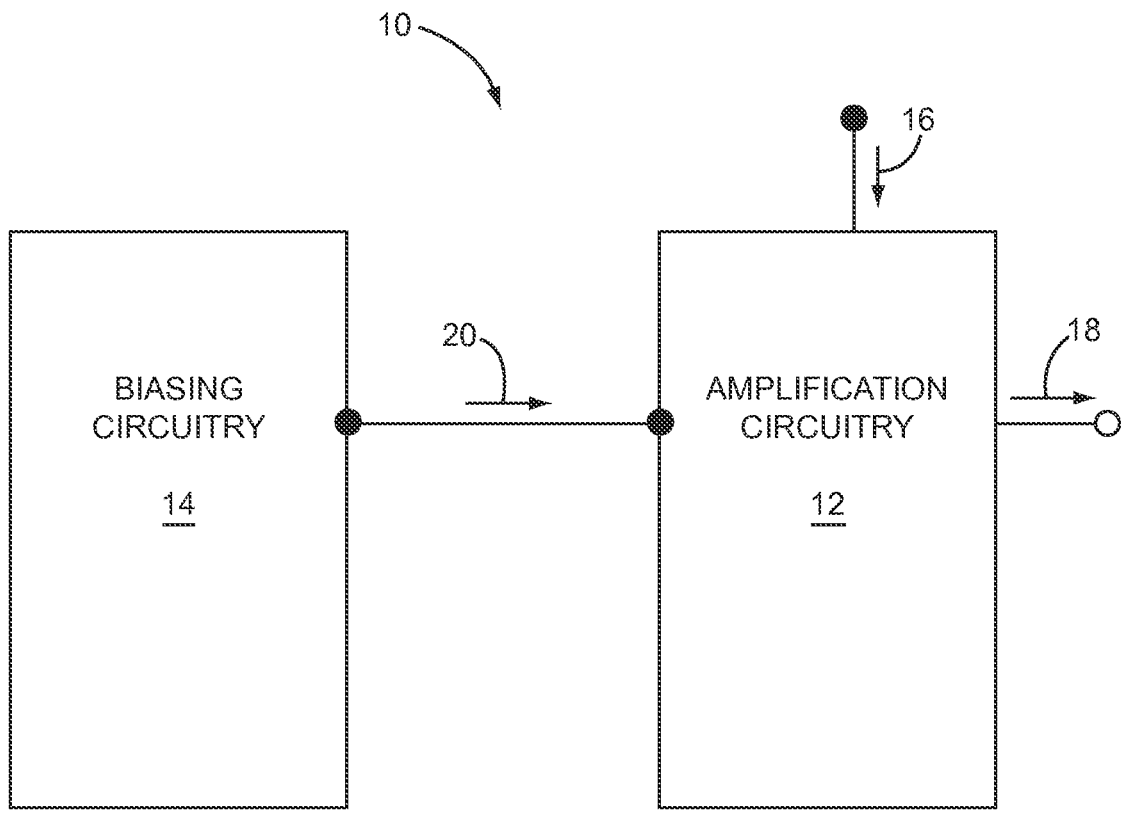
FIG. 1 is a system diagram of a prior art amplification device.
Figure 2:
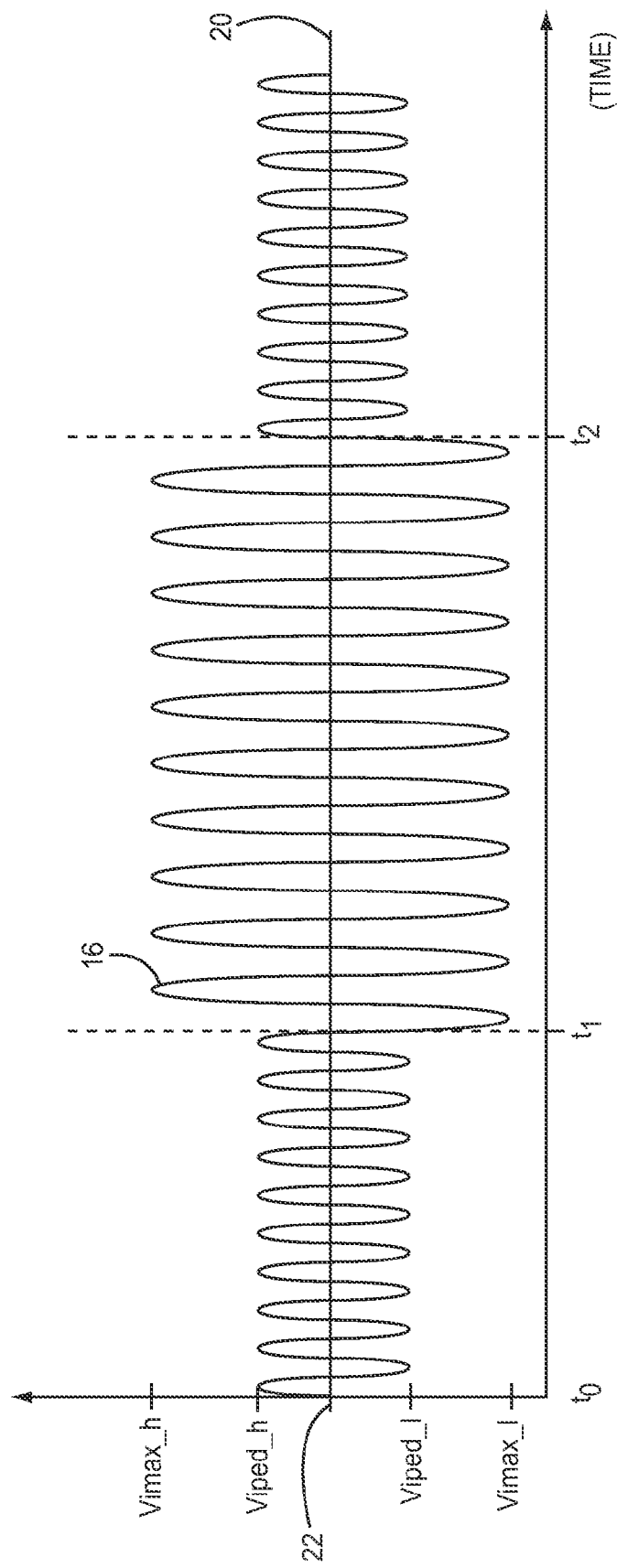
FIG. 2 is a graph of an input signal received by the prior art amplification device of FIG. 1.
Figure 3:
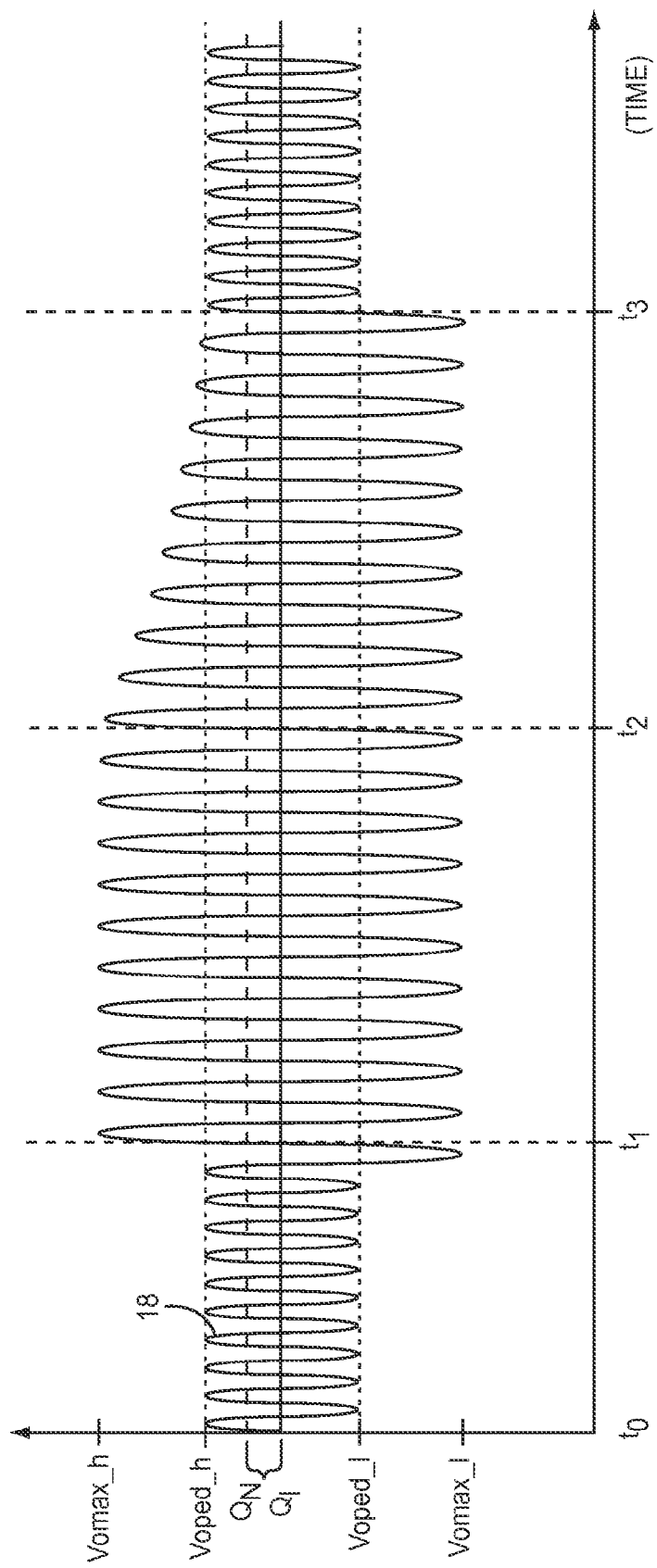
FIG. 3 is a graph of an amplified output signal generated by the prior art amplification device of FIG. 1.
Figure 4:
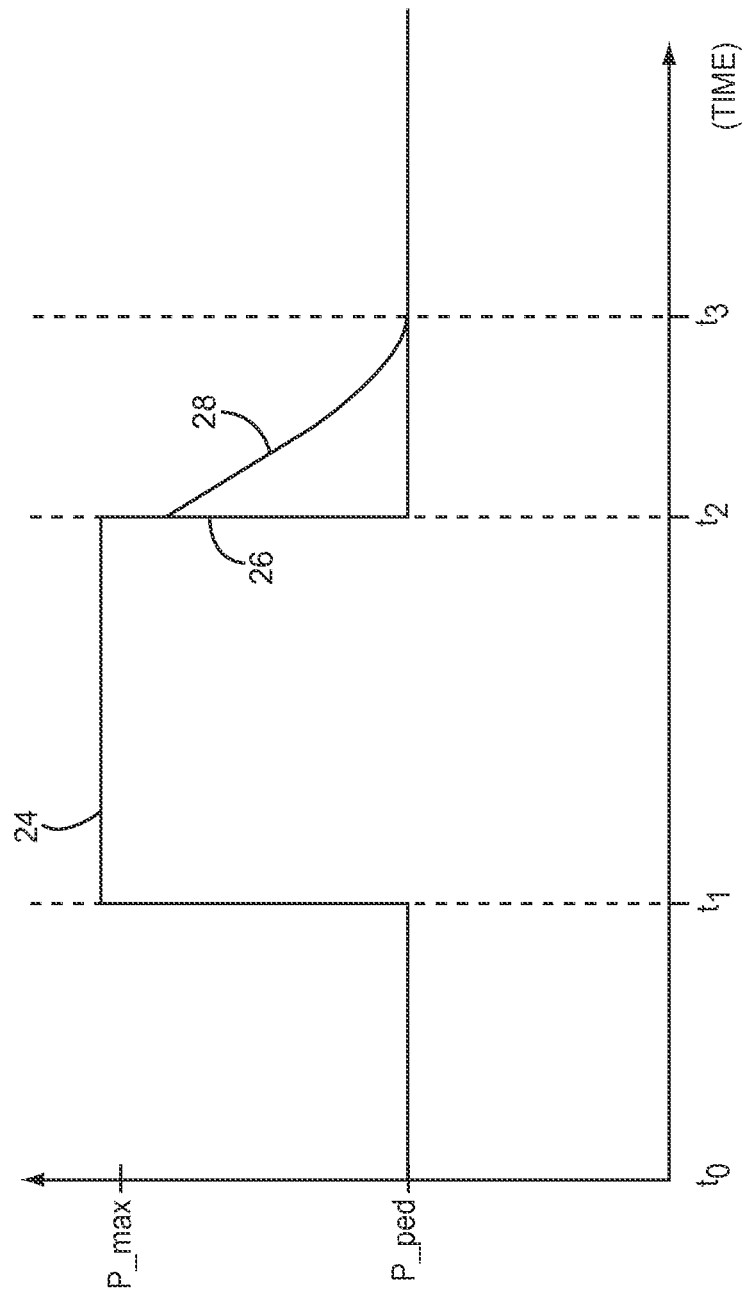
FIG. 4 is a graph of an average power curve of the prior art amplification device of FIG. 1.
Figure 5:
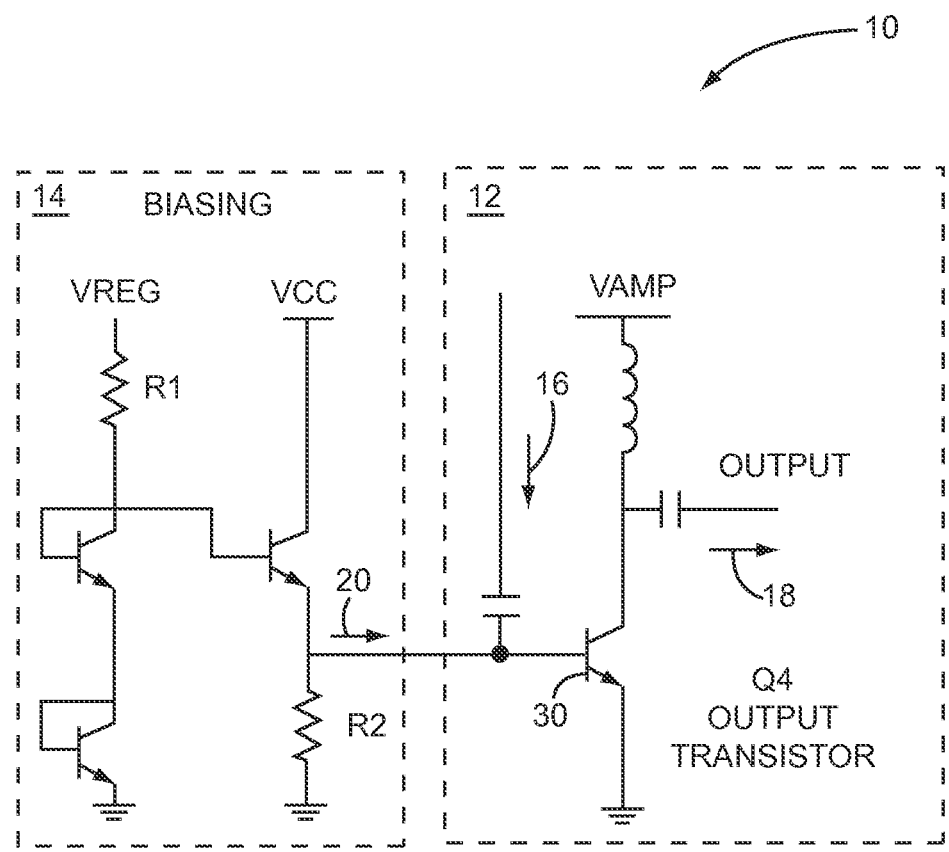
FIG. 5 is a circuit diagram of the prior art amplification device from FIG. 1.
Figure 6:
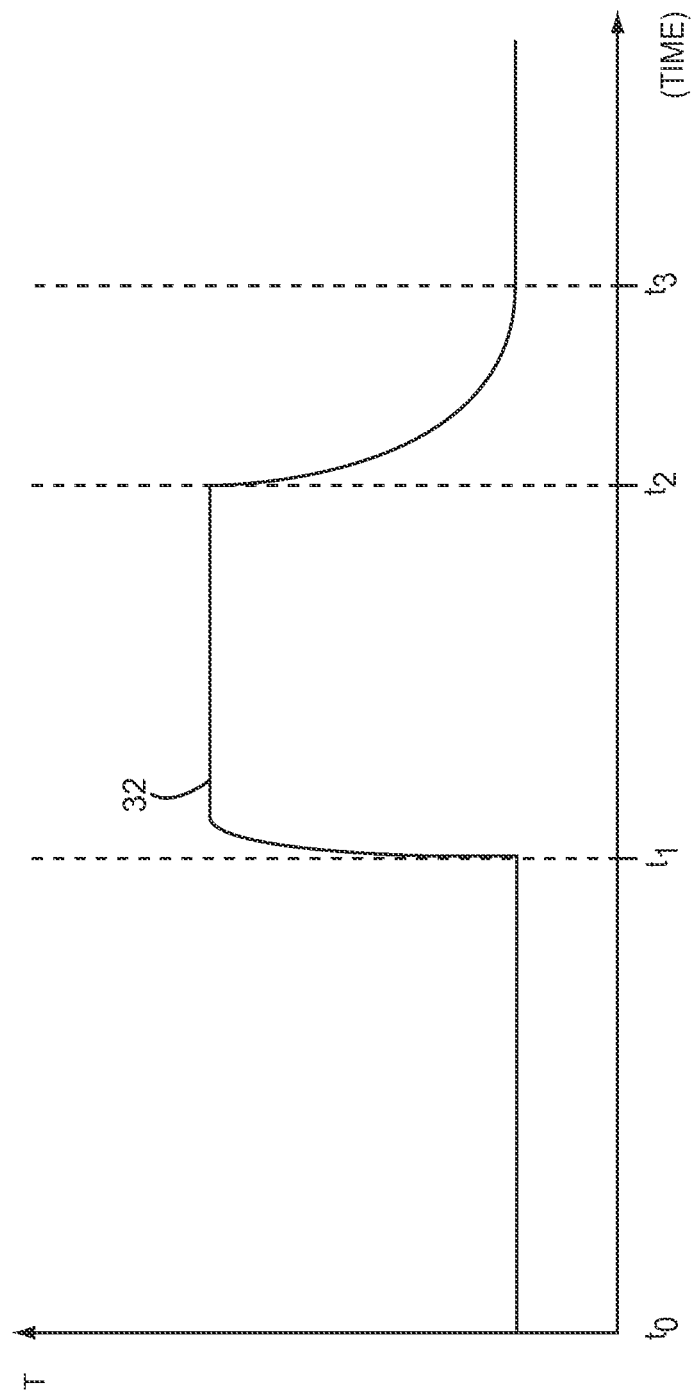
FIG. 6 is a graph of a temperature associated with the amplification circuit for the prior art amplification device illustrated by FIG. 5.
Figure 7:
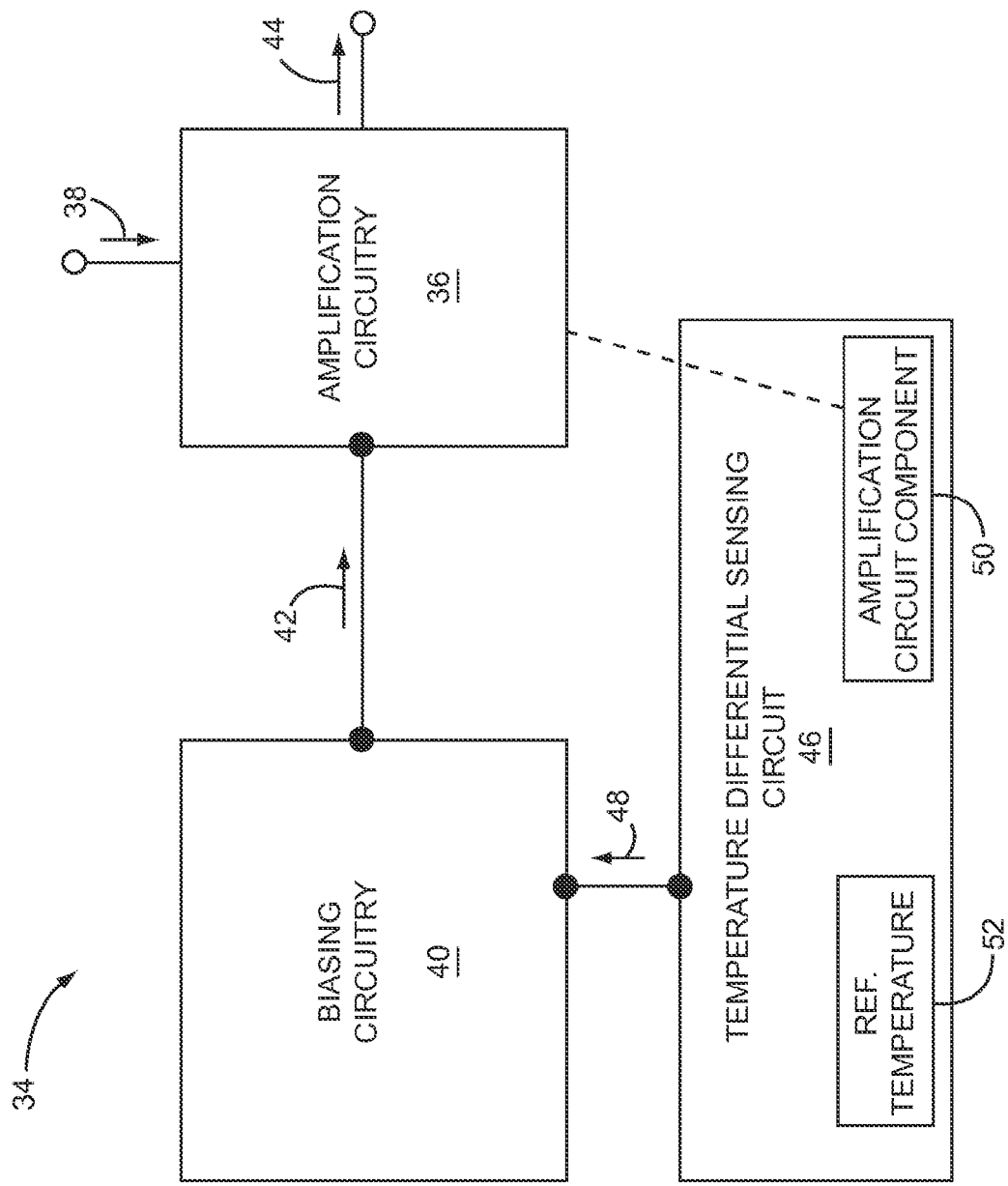
FIG. 7 is a system diagram of a first embodiment of an amplification device in accordance with the disclosure.

The present disclosure generally relates to amplification devices and methods of amplifying input signals. More specifically, the disclosure relates to amplification devices and methods that reduce, compensate, and/or eliminate a local thermal memory effect of an amplification device. FIG. 7 illustrates one embodiment of an amplification device 34 in accordance with the disclosure. The amplification device 34 includes an amplification circuit 36 that receives an input signal 38. Biasing circuitry 40 is coupled to the amplification circuit 36 and generates a biasing signal 42. As shall be explained in further detail below, the biasing signal 42 provides a bias level to the input signal 38. This input signal 38 is then amplified by the amplification circuit 36 in accordance to the gain of the amplification circuit 36 to generate an amplified output signal 44.

The input and output signals 38, 44 may be any type of signal or combination of signals, such as radio frequency (RF) signals, voltage signals, current signals, power signals, and/or digital signals. The input and amplified output signals 38, 44 may be the same type of signals or the amplification circuit 36 may generate a different type of amplified output signal 44. For example, if the gain of the amplification circuit 36 is a constant, then the amplified output signal 44 may take the basic form of the input signal 38 after its values have been increased in accordance with the constant. On the other hand, if the gain of the amplification circuit 36 varies, the form of the amplified output signal 44 may not take the same form as the input signal 38. The form of the amplified output signal 44 may also be different from the input signal 38 based on, for example, the frequency response characteristics of the components in the amplification device 34. The amplification circuit 36 may be any type of amplification circuit 36 or combination of amplification circuits 36 including, for example, a transistor, or any combination of transistors, an op-amp, a power amplifier, a voltage amplifier, a current amplifier, a distributed amplifier, a microwave amplifier, and/or the like.

The quiescent operating level of the amplified output signal 44 is the signal level of the amplified output signal 44 when no input signal 38 is received by the amplification circuit 36. Thus, the quiescent operating level of the amplified output signal 44 is set by a bias level of the biasing signal 42 from the biasing circuitry 40. The biasing signal 42 may be a DC signal so that the bias level is constant or substantially constant. In other embodiments, there may be designed variations in the bias level. This of course will depend on the type and the application for the amplification device 34.

To prevent the quiescent operating level of the amplified output signal 44 from drifting away from a desired level, a temperature differential sensing circuit 46 may be coupled to the biasing circuitry 40 and generate a bias level adjustment signal 48. By adjusting the bias level of the biasing signal 42, the quiescent operating level of the amplified output signal 44 can be maintained at the desired level. The temperature differential sensing circuit 46 may include an amplification temperature sensing component 50 that is thermally associated with the amplification circuit 36, and a reference temperature sensing component 52. The amplification temperature sensing component 50 measures or operates in accordance with a temperature associated with the amplification circuit 36. Similarly, the reference temperature sensing component 52 measures or operates in accordance with a reference temperature. When the temperature differential sensing circuit 46 detects a temperature difference between the amplification temperature sensing component 50 and the reference temperature sensing component 52, the bias level adjustment signal 48 adjusts a bias level of the biasing signal 42 to maintain the quiescent operating level of the amplified output signal 44 at or near the desired level. The bias level adjustment signal 48 may be time continuous, digital, and/or adaptive.

Figure 8:
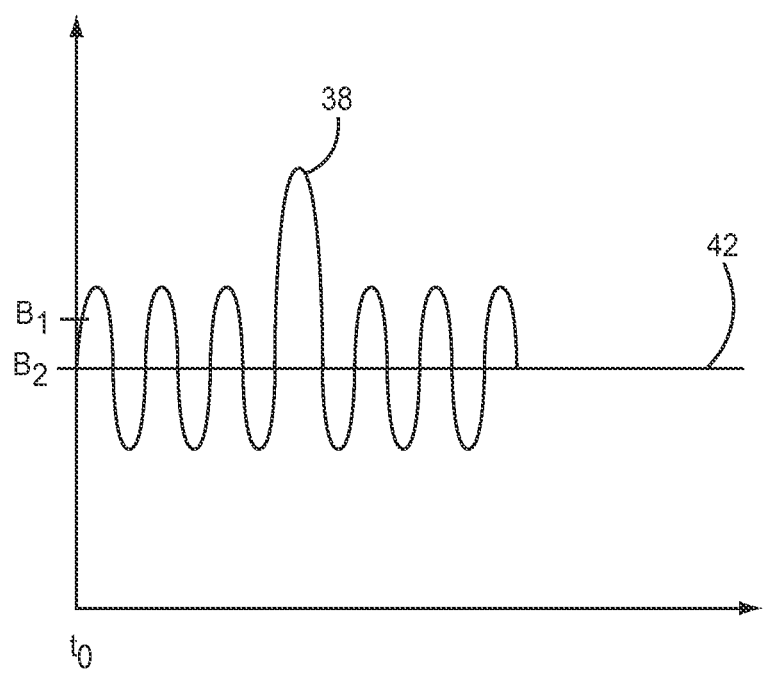
FIG. 8 is a graph of an input signal received by the first embodiment of the amplification device illustrated in FIG. 7.
Figure 9:
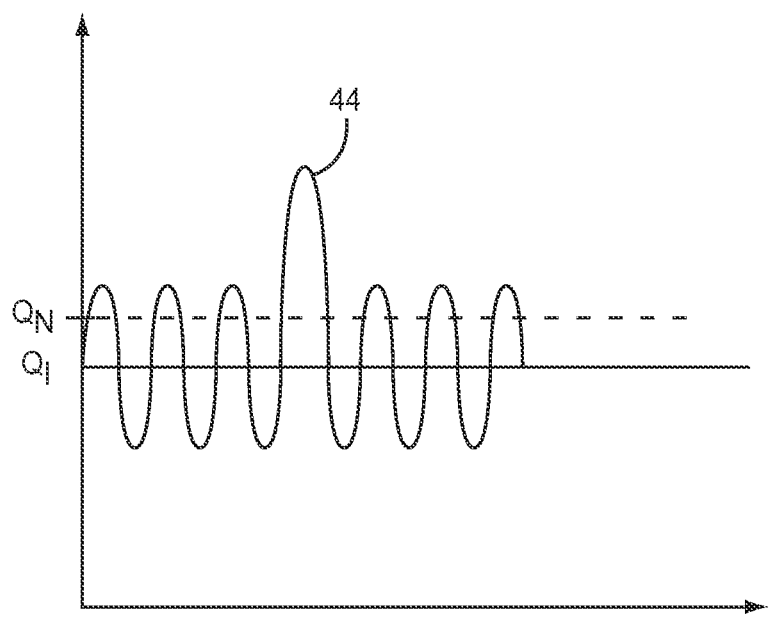
FIG. 9 is a graph of an amplified output signal generated by the first embodiment of the amplification device illustrated in FIG. 7.

The adjustment of the bias level of the biasing signal 42 to maintain the quiescent operating level is illustrated by FIGS. 8 and 9. The input signal 38 is illustrated in FIG. 8 after the bias level adjustment signal 48 (shown in FIG. 7) has adjusted the bias level of the biasing signal 42 from $B_1$ to $B_2$. In this example, the biasing signal 42 is a DC signal. Originally, the biasing signal 42 was at the bias level, $B_1$. However, as the amplification circuit 36 or a component(s) in the amplification circuit begin to heat up, a temperature difference is detected between the amplification temperature sensing component 50 (illustrated in FIG. 7) and the reference temperature sensing component 52 (illustrated in FIG. 7). FIG. 9 shows the quiescent operating level, $Q_I$, of the amplified output signal 44. If the bias level of the biasing signal 42 were not adjusted, the quiescent operating level, $Q_I$, would drift to the undesired level, $Q_N$. However, the bias level adjustment signal 48 is based on the temperature difference detected by the temperature differential sensing circuit 46 which adjusts the bias level of the biasing signal 42 to $B_2$. This maintains the quiescent operating level, $Q_I$, at the desired level.

In this example, the bias level of the biasing signal 42 is lowered by the bias level adjustment signal 48 from $B_1$ to $B_2$ which thereby prevents the quiescent operating level, $Q_I$, from drifting upwards to $Q_N$. This assumes that the amplification circuit 36 (shown in FIG. 7) has a positive gain. In other embodiments, the bias level of the biasing signal 42 may actually be raised in order to keep the quiescent operating level, $Q_I$, from drifting upwards to $Q_N$. Thus, how and by how much the bias level adjustment signal 48 adjusts the bias level of the biasing signal 42 may depend on the operation of the amplification circuit 36.

Figure 10:
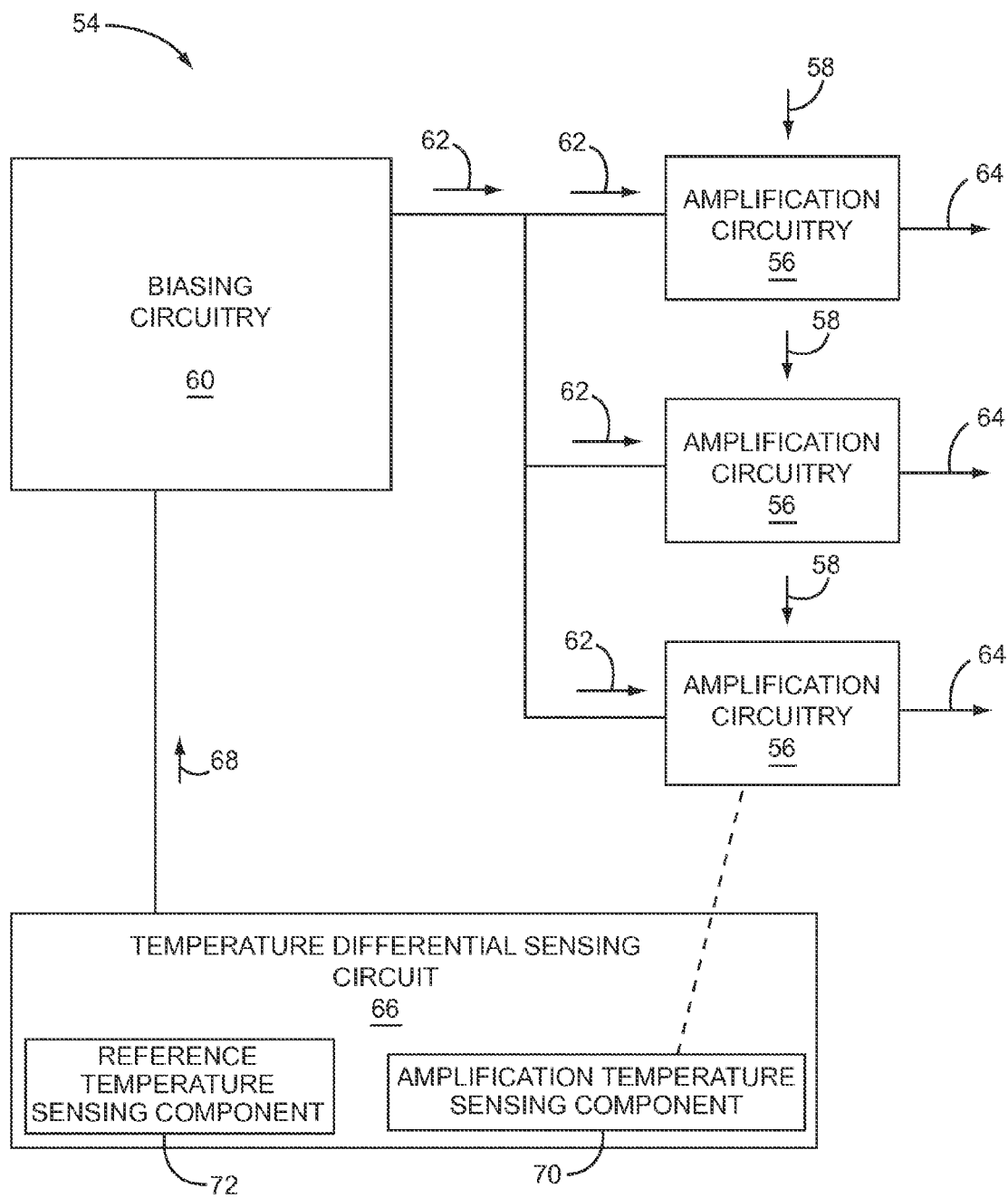
FIG. 10 is a system diagram of a second embodiment of an amplification device in accordance with the disclosure.

Next, FIG. 10 illustrates a second embodiment of an amplification device 54 having multiple amplification circuits 56. Each amplification circuit 56 receives an input signal 58. In this embodiment, biasing circuitry 60 is coupled to each of the amplification circuits 56 to provide a biasing signal 62 that applies a bias level to each of the input signals 58. These input signals 58 may then be amplified by the amplification circuits 56 in accordance with the gain of the amplification circuits 56 to generate amplified output signals 64. In an alternative embodiment, each biasing circuitry 60 is coupled to a different biasing circuitry 60.

To prevent a quiescent operating level of the amplified output signals 64 from drifting away from a desired level, temperature differential sensing circuit 66 may be coupled to the biasing circuitry 60 to generate a bias level adjustment signal 68. By adjusting the bias level of the biasing signal 62, the quiescent operating level of the amplified output signals 64 can be maintained at the desired level. In this embodiment, the amplification device 54 has one temperature differential sensing circuit 66 that includes an amplification temperature sensing component 70 that is thermally associated with one of the amplification circuits 56. This is advantageous if each of the amplification circuits 56 have substantially similar thermal characteristics. In alternative embodiments, multiple temperature differential sensing circuits 66 are provided each having an amplification temperature sensing component 70 thermally associated with different amplification circuits 56.

The temperature differential sensing circuit 66 in the illustrated embodiment also includes a reference temperature sensing component 72. The amplification temperature sensing component 70 measures or operates in accordance with a temperature associated with the thermally associated amplification circuits 56. The reference temperature sensing component 72 measures or operates in accordance with a reference temperature. This may be accomplished, for example, by operating the reference temperature sensing component 72 in accordance with a constant DC voltage having a voltage level calibrated to represent the reference temperature. When the temperature differential sensing circuit 66 detects a temperature difference between the amplification temperature sensing component 70 and the reference temperature sensing component 72, the bias level adjustment signal 68 adjusts a bias level of the biasing signal 62 to maintain the quiescent operating level of the amplified output signals 64 at or near a desired level.

Figure 11:
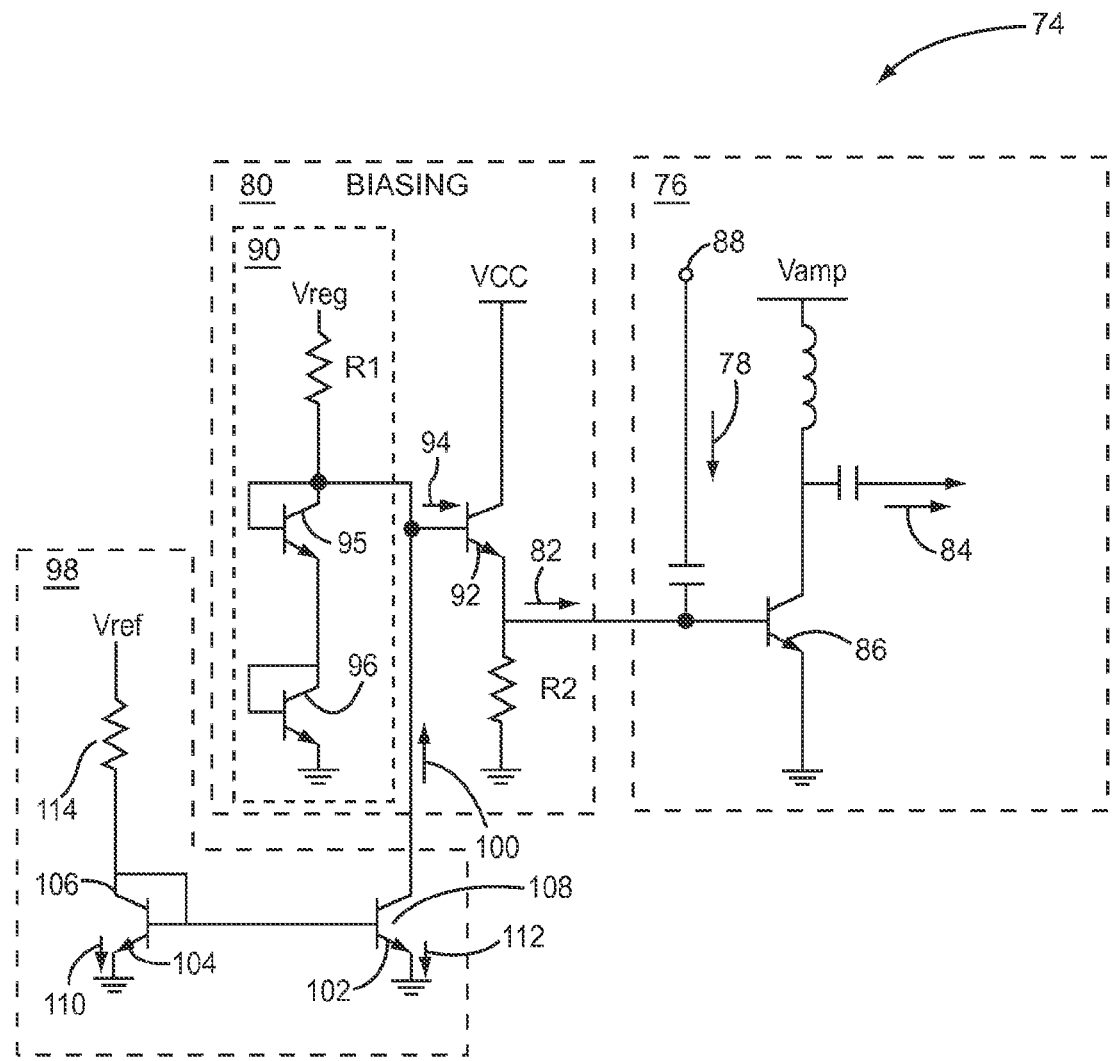
FIG. 11 is a circuit diagram of a third embodiment of an amplification device in accordance with the disclosure.

FIG. 11 is a circuit diagram illustrating a third embodiment of an amplification device 74 in accordance with the disclosure. The amplification device 74 includes an amplification circuit 76 that receives an input signal 78. Biasing circuitry 80 is coupled to the amplification circuit 76 and generates a biasing signal 82. The biasing signal 82 provides a bias level to the input signal 78. This input signal 78 is then amplified by the amplification circuit 76 in accordance with the gain of the amplification circuit 76 to generate an amplified output signal 84.

The amplification device 74 may be utilized, for example, when the input signal 78 is an RF input or output signal. In this embodiment, the amplification circuit 76 includes a transistor 86, which in this example is a Heterojunction Bipolar Transistor (HBT). However, any suitable transistor type may be used, such as without limitation, any suitable bipolar junction transistors (BJT) or field effect transistor (FET). In this embodiment, the base terminal of the transistor 86 is connected to the biasing circuitry 80 and to the input terminal 88. The biasing signal 82 and the input signal 78 are combined at the base terminal of the transistor 86 so as to provide the input signal 78 so that it is biased in accordance with a signal level of the biasing signal 82. This signal level of the biasing signal 82 may thus provide the bias level to the input signal 78. Accordingly, the quiescent operating level of the amplified output signal 84 is set by the signal level of the biasing signal 82 because the quiescent operating level of the amplified output signal 84 is the level of the amplified output signal 84 when no input signal 78 is being received by the amplification circuit 76.

The collector terminal of the transistor 86 is coupled to an amplification voltage, $V_{amp}$, which provides the necessary energy for the transistor 86 to amplify the input signal 78 which has been biased by the biasing signal 82. The emitter terminal of the transistor 86 is coupled to ground. The amplified output signal 84 in this embodiment is an output voltage from the collector terminal to the emitter terminal of the transistor 86.

The biasing circuitry 80 may include a biasing regulation circuit 90 and a transistor 92. The biasing regulation circuit 90 outputs a bias level input signal 94 that is received by the transistor 92. The transistor 92 outputs the biasing signal 82 based on the bias level input signal 94. Thus, the bias level input signal 94 determines the signal level of the biasing signal 82. The biasing regulation circuit 90 includes a pair of transistors 95, 96 which are coupled to a regulation voltage, $V_{reg}$. Each of the transistors 95, 96 are HBTs having their base terminals coupled to their collector terminals. Thus, transistors 95, 96 operate similarly to diodes and prevent any current from reaching ground. However, these transistors 95, 96 do consume a voltage from the base terminals to the emitter terminals. Thus, a signal level of the bias level input signal 94 can be maintained relatively stable. If there are any sudden increases in the regulation voltage, $V_{reg}$, the additional voltage will be consumed by the transistors 95, 96 thus maintaining the current level of the biasing level input signal 94 relatively steady. Also, if transistors 92, 95, 96 are similar components, then the voltage level of the bias level input signal 94 may be around the same as the base to the emitter voltage of one of the transistors 92, 95, 96.

To prevent a quiescent operating level of the amplified output signal 84 from drifting away from a desired level, a temperature differential sensing circuit 98 may be coupled to the biasing circuitry 80 and generate a bias level adjustment signal 100. By adjusting the bias level of the biasing signal 82, the quiescent operating level of the amplified output signal 84 can be maintained at the desired level. In this embodiment, the temperature differential sensing circuit 98 is a mirror circuit having an amplification temperature sensing component 102 and a reference temperature sensing component 104. The amplification temperature sensing component 102 is thermally associated with the amplification circuit 76 and thus the temperature of the amplification circuit 76 affects the temperature of the amplification temperature sensing component 102. In this case, the amplification temperature sensing component 102 is placed close to the transistor 86 so that, as the transistor 86 heats up, so may the amplification temperature sensing component 102.

The reference temperature sensing component 104 is thermally associated with a reference temperature. The reference temperature may be associated with the biasing circuitry 80 or may be associated with a cool portion of the material on which the amplification device 74 is built on or from, and/or some other device not thermally associated with the amplification circuit 76. In this embodiment, the reference temperature sensing component 104 is thermally associated with the cool portion (not shown) of the material on which the amplification device 74 is built on or from. Thus, the amplification temperature sensing component 102 is operated in accordance with the temperature of the transistor 86 and the reference temperature sensing component 104 is operated in accordance with the cool portion of the material on which the amplification device 74 is built on or from. So long as these temperatures are the same, the amplification temperature sensing component 102 and the reference temperature sensing component 104 operate substantially the same. However, once the temperature of the transistor 86 and the temperature of the cool portion of the material on which the amplification device 74 is built on or from differs, the temperature difference causes the amplification temperature sensing component 102 to behave differently from the reference temperature sensing component 104 and thus a temperature difference is detected.

For example, in this embodiment, the amplification temperature sensing component 102 and the reference temperature sensing component 104 are transistors, 106, 108, respectively. The transistors 106, 108 illustrated in FIG. 11 are HBTs. The transistor 106 has its emitter terminal connected to ground. Its collector-base voltage is zero since both the collector terminal and the emitter terminal are set by the voltage, $V_{ref}$. Consequently, the voltage drop across transistor 106 is the base-emitter voltage; that is, this voltage is set by the diode law and transistor 106 is said to be diode connected. The transistor 106 outputs a reference current signal 110 from the emitter terminal.

The base terminal of the transistor 106 is coupled to the base terminal of the transistor 108 so that the base-emitter voltage of the transistor 106 sets the base-emitter voltage for the transistor 108. If transistors 106, 108 have substantially the same device properties, and if the output voltage is chosen so the collector-base voltage of transistor 108 is also substantially zero, then the base-emitter voltage set by transistor 106 results in the transistor 108 generating a sensing component current signal 112 that mirrors the reference current signal 110. As illustrated in FIG. 11, the collector terminal of the transistor 108 in this embodiment is coupled to the base terminal of transistor 92 within the biasing circuitry 80. So long as the base-emitter voltage provided by the bias level input signal 94 is maintained to be substantially equal to the base-emitter voltage of the transistor 106, the sensing component current signal 112 will continue to mirror the reference current signal 110. In turn, no bias level adjustment signal 100 may be generated by the temperature differential sensing circuit 98.

However, as the temperature of the transistor 86 in the amplification circuit 76 heats up, so does the transistor 108. In turn, this causes the base-emitter voltage of the transistor 108 to decrease and the collector-base voltage of the transistor 108 to not be substantially zero. This causes the reference current signal 110 and the sensing component current signal 112 to be substantially different and the temperature difference is detected.

In turn, this generates the bias level adjustment signal 100 which in this embodiment is a negative current relative to the base terminal of the transistor 92. As a result, the signal level of the biasing signal 82 is adjusted in accordance with the temperature difference between the transistor 86 and the temperature of the cool portion of the material on which the amplification device 74 and the quiescent operating level of the amplified output signal 84 may be maintained at a desired level.

The signal level of the bias level adjustment signal 100 may have a relationship to the size of the temperature difference between the transistor 86 and the cool portion of the material on which the amplification device 74 is built on or from. Thus, the size of the temperature difference may determine the change in the signal level of the bias level adjustment signal 100. To adjust this relationship, an adjustable resistor 114 is provided between the reference voltage, $V_{ref}$ and the collector terminal of the transistor 106. By adjusting the resistance of the adjustable resistor 114, a signal level of the reference current signal 110 is also adjusted. This in turn may determine at what signal level the sensing component current signal 112 mirrors the reference current signal 110. If the reference current signal 110 has a relatively low signal level then a particular change in the temperature of the transistor 86 may cause a relatively high signal level of the bias level adjustment signal 100. On the other hand, if the reference current signal 110 has a relatively high signal level then the same change in the temperature of transistor 86 may cause a relatively low signal level of the bias level adjustment signal 100. In this manner, the relationship of the size of the temperature difference and the signal level of the bias level adjustment signal 100 can be adjusted. This relationship may also be changed by physically repositioning transistor 108 relative to transistor 86 in the amplification circuit 76, by adjusting the reference voltage, $V_{ref}$, or by implementing a controllable current source. The ability to adjust the relationship between the change in the signal level of the bias level adjustment signal 100 and the size of the temperature difference is advantageous because, in some cases, it may be difficult to predict the thermal transient response of transistor 86.

Figure 12:
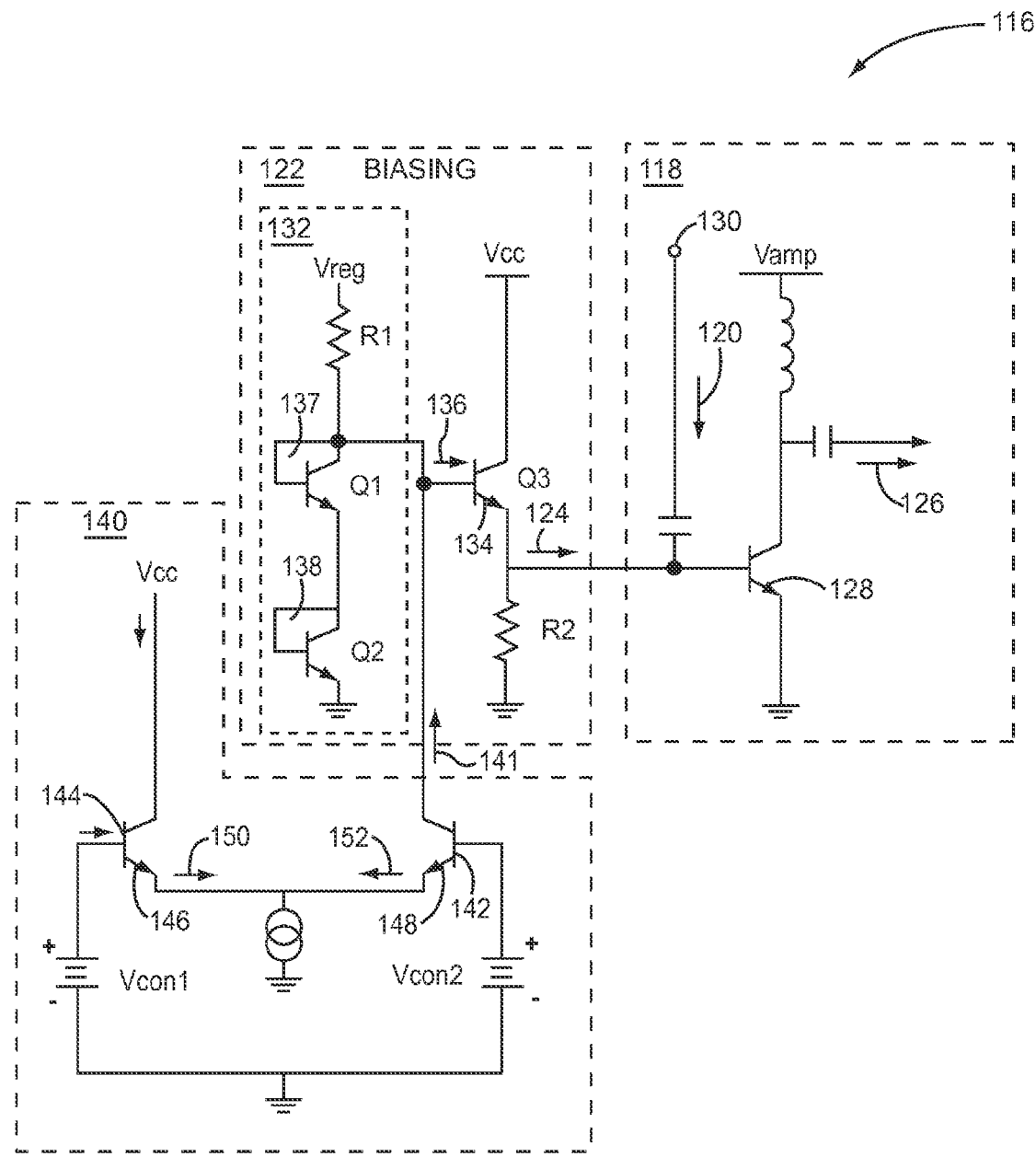
FIG. 12 is a circuit diagram of a fourth embodiment of an amplification device in accordance with the disclosure.

FIG. 12 illustrates a fourth embodiment of an amplification device 116 in accordance with the disclosure. The amplification device 116 includes an amplification circuit 118 that receives an input signal 120. Biasing circuitry 122 is coupled to the amplification circuit 118 and generates a biasing signal 124. The biasing signal 124 provides a bias level to the input signal 120. This input signal 120 is then amplified by the amplification circuit 118 in accordance with the gain of the amplification circuit 118 to generate an amplified output signal 126.

The amplification device 116 may be utilized, for example, when the input signal 120 is an RF input or output signal. In this embodiment, the amplification circuit 118 includes a transistor 128, which in this example is an HBT. The base terminal of the transistor 128 is connected to the biasing circuitry 122 and to the input terminal 130. The biasing signal 124 and the input signal 120 are combined at the base terminal of the transistor 128 so as to provide the input signal 120 biased in accordance with a signal level of the biasing signal 124. This signal level of the biasing signal 124 may thus provide the bias level to the input signal 120. Accordingly, the quiescent operating level of the amplified output signal 126 is set by the signal level of the biasing signal 124 because the quiescent operating level of the amplified output signal 126 is the level of the amplified output signal 126 when no input signal 120 is being received by the amplification circuit 118.

The collector terminal of the transistor 128 is coupled to an amplification voltage, $V_{amp}$, that provides the necessary energy for transistor 128 to amplify the input signal 120 which has been biased by the biasing signal 124. The emitter terminal of the transistor 128 is coupled to ground. The amplified output signal 126 in this embodiment is an output voltage from the collector terminal to the emitter terminal of the transistor 128.

The biasing circuitry 122 may include a biasing regulation circuit 132 and a transistor 134. The biasing regulation circuit 132 outputs a bias level input signal 136 that is received by the transistor 134. The transistor 134 outputs the biasing signal 124 based on the bias level input signal 136. Thus, the bias level input signal 136 determines the signal level of the biasing signal 124. The biasing regulation circuit 132 includes a pair of transistors 137, 138 which are coupled to a regulation voltage, $V_{reg}$. Each of the transistors 137, 138 are HBTs having their base terminals coupled to their collector terminals. Thus, transistors 137, 138 operate similar to diodes and prevent any current from reaching ground. However, these transistors 137, 138 do consume a voltage from the base terminals to the emitter terminals. Thus, one can maintain a signal level of the bias level input signal 136 that is relatively stable. If there are any sudden increases in the regulation voltage, $V_{reg}$, the additional voltage will be consumed by the transistors 137, 138 thus maintaining the current level of the bias level input signal 136 that is relatively steady. Also, if transistors 134, 137, 138 are similar components then the voltage level of the biasing signal is equal to the voltage from the base to the emitter terminals of one of the transistors 134, 137, 138.

To prevent a quiescent operating level of the amplified output signal 126 from drifting away from a desired level, a temperature differential sensing circuit 140 may be coupled to the biasing circuitry 122 and provide a bias level adjustment signal 141. By adjusting the bias level of the biasing signal 124, the quiescent operating level of the amplified output signal 126 can be maintained at the desired level. In this embodiment, the temperature differential sensing circuit 140 is a mirror circuit having an amplification temperature sensing component 142 and a reference temperature sensing component 144. The amplification temperature sensing component 142 is thermally associated with the amplification circuit 118 and thus the temperature of the amplification circuit 118 affects the temperature of the amplification temperature sensing component 142. In this case, the amplification temperature sensing component 142 is physically placed close to the transistor 128 so, as the transistor 128 heats up, so may the amplification temperature sensing component 142.

The reference temperature sensing component 144 is thermally associated with a reference temperature. In this embodiment, the reference temperature is associated with the transistor 138 in the biasing circuitry 122. The amplification temperature sensing component 142 and the reference temperature sensing component 144 are operated in accordance with the temperature of the transistor 128 and transistor 138, respectively. So long as these temperatures are the same, the amplification temperature sensing component 142 and the reference temperature sensing component 144 operate substantially the same. However, once the temperature of the transistor 128 and the temperature of transistor 138 differ, the temperature difference causes the amplification temperature sensing component 142 to behave differently from the reference temperature sensing component 144 and thus a temperature difference is detected.

For example, in this embodiment, the amplification temperature sensing component 142 and the reference temperature sensing component 144 are transistors, 148, 146, respectively. The transistors 146, 148 illustrated in FIG. 12 are HBTs. The transistor 146 has its emitter terminal connected to ground and the base-emitter voltage is controlled by the base-emitter voltage, $V_{con1}$. A reference voltage, $V_{cc}$, may be coupled to the collector terminal of the transistor 146 to generate a reference current signal 150 from the emitter terminal of transistor 146. Similarly, the transistor 148 has its emitter terminal connected to ground and the base-emitter voltage is controlled by the base-emitter voltage, $V_{con2}$. The collector terminal of the transistor 148 may be coupled to the base terminal of the transistor 134 in the biasing circuitry 122. The transistor 148 generates a sensing component signal 152 from its emitter terminal. The transistors 144, 148 are thus coupled as a differential pair that detects a difference between the reference current signal 150 and the sensing component signal 152.

In this embodiment, the collector terminal of transistor 148 is coupled to the base terminal of the transistor 134 to generate the bias level adjustment signal 141. The bias level adjustment signal 141 may be a negative current relative to the base terminal of transistor 134. The bias level adjustment signal 141 adjusts a signal level of the bias level input signal 136 and thereby consequently adjusts a signal level of the biasing signal 124. Thus, bias level adjustment signal 141 is operable to adjust the quiescent operating level of the amplified output signal 126.

If transistors 146, 148 are heated to substantially the same temperature by transistors 138, 128, respectively, then the difference between the reference current signal 150 and the sensing component signal 152 remains about the same. As such, the signal level of the bias level adjustment signal 141 also remains the same. The transistors 146, 148 may be selected to have substantially the same device properties. Notice that while the transistor 128 may heat up, the bias level adjustment signal 141 remains at substantially the same level if transistor 128 and transistor 138 have similar temperature increases. Thus, the quiescent operating level remains the same if transistors 134, 137, 138 and transistor 128 in the amplification circuit 118 have substantially the same device properties. If transistors 128, 134, 137, 138 heat up symmetrically then their base-emitter voltages drop symmetrically and the quiescent operating level of the amplified output signal 126 remains substantially stable. Thus, the signal levels of the reference current signal 150 and the sensing component signal 152 may also change symmetrically. Since no temperature difference has been detected, the signal level of the bias level adjustment signal 141 remains about the same and the signal level of the biasing signal 124 is not adjusted by the symmetrical increase in temperature of the transistor 128, 138.

However, during high amplitude bursts from the input signal 120, the transistor 128 may heat up to a higher temperature than the transistors 134, 137, 138 in the biasing circuitry 122. Thus, the difference between the reference current signal 150 and the sensing component signal 152 changes and a temperature difference is detected between the transistors 128, 138. As a result, the signal level of the bias level adjustment signal 141 is adjusted in accordance with the temperature difference. In response to the adjustment of the signal level in the bias level adjustment signal 141, the signal level of the biasing signal 124 is also adjusted. In this manner, the quiescent operating level of the amplified output signal 126 may be maintained at a desired level.

If the characteristics of transistors 146, 148 are substantially the same, the base-emitter voltages, $V_{con1}$, $V_{con2}$, may be chosen to be substantially the same. Thus, a difference in temperature between transistors 128, 138 also cause a difference in temperature between transistors 146, 148. This temperature difference causes a difference in the reference current signal 150 and the sensing component signal 152 thereby detecting the temperature difference in transistors 128, 138. In response, the signal level of the bias level adjustment signal 141 is adjusted, which thereby adjusts the biasing signal 124. Accordingly, the quiescent operating level of the amplified output signal 126 can be maintained at a desired level.

In this embodiment, the signal level of the bias level adjustment signal 141 may be related to the size of the temperature difference between the transistors 128, 138. This relationship may include the change in the signal level of the bias level adjustment signal 141 relative to the size of the temperature difference between the transistors 128, 138. The base-emitter voltages, $V_{con1}$, $V_{con2}$, may be utilized to adjust this relationship. This relationship may also be changed by physically repositioning transistor 146, 148, relative to transistor 138, 128, respectively, by adjusting the reference voltage, $V_{cc}$, or by implementing a controllable current source.

Those skilled in the art will recognize improvements and modifications to the preferred embodiments of the present disclosure. All such improvements and modifications are considered within the scope of the concepts disclosed herein and the claims that follow.

What is claimed is:

1. An amplification device that is capable of reducing thermal drift, comprising:
    an amplification circuit operable to receive an input signal and generate an amplified output signal from the input signal;
    biasing circuitry operable to generate a biasing signal and coupled to the amplification circuit wherein the amplification circuit is operably associated with the biasing circuitry so that a quiescent operating level of the amplified output signal is set in accordance with a signal level of the biasing signal; and
    a temperature differential sensing circuit comprising a mirror circuit configured to detect a temperature difference between a first temperature associated with the amplification circuit and a reference temperature and to generate a bias level adjustment signal based on the temperature difference wherein the biasing circuitry is operably associated with the temperature differential sensing circuit so as to adjust the signal level of the biasing signal in response to the bias level adjustment signal.

2. The amplification device of claim 1 wherein the temperature differential sensing circuit further comprises an amplification temperature sensing component that is thermally associated with the amplification circuit and operates in accordance with the first temperature.

3. The amplification device of claim 1 wherein the temperature differential sensing circuit further comprises a reference temperature sensing component that operates in accordance with the reference temperature.

4. The amplification device of claim 1 wherein the temperature differential sensing circuit comprises:
    an amplification temperature sensing component thermally associated with the amplification circuit and configured to operate in accordance with the first temperature; and
    a reference temperature sensing component configured to operate in accordance with the reference temperature, wherein the temperature differential sensing circuit is operable to detect a difference in the operation of the reference temperature sensing component and the amplification temperature sensing component to detect the temperature difference.

5. The amplification device of claim 4 wherein the reference temperature sensing component is thermally associated with the biasing circuitry.

6. The amplification device of claim 1 wherein the reference temperature is associated with the biasing circuitry.

7. The amplification device of claim 1 wherein a signal level of the bias level adjustment signal has a relationship to a size of the temperature difference and the temperature differential sensing circuit is operable to adjust the relationship.

8. The amplification device of claim 1 wherein the mirror circuit, comprises:
    a reference temperature sensing component operable to generate a reference signal in accordance with the reference temperature; and
    an amplification temperature sensing component thermally associated with the amplification circuit, the amplification temperature sensing component being operable to generate a sensing component signal associated with the first temperature so that the sensing component signal substantially mirrors the reference signal when the reference temperature and first temperature are substantially equal and the reference signal and sensing component signal being substantially different when the reference temperature and the first temperature are substantially different whereby the temperature difference is detected.

9. The amplification device of claim 8 wherein:
    the biasing circuitry comprises a biasing regulation circuit that outputs a bias level input signal and a first transistor operable to receive the bias level input signal and output the biasing signal; and
    the amplification temperature sensing component is coupled to the first transistor such that the bias level adjustment signal adjusts the bias level input signal.

10. The amplification device of claim 8 wherein:
    the reference temperature sensing component comprises a first transistor coupled to a reference voltage; and
    the amplification temperature sensing component comprises a second transistor coupled to the first transistor.

11. The amplification device of claim 10 wherein the mirror circuit further comprises an adjustable resistor coupled between the reference voltage and the first transistor such that adjusting the adjustable resistor adjusts a signal level of the reference signal.

12. The amplification device of claim 10 wherein the first transistor includes a first base terminal and the second transistor includes a second base terminal, wherein the first and second base terminals are coupled to one another.

13. The amplification device of claim 1 the temperature differential sensing circuit comprises:
   a first transistor coupled to a reference voltage and being operable to generate a reference signal;
   a second transistor coupled to the first transistor such that the first and second transistors are coupled as a differential pair, the second transistor being operable to generate a sensing component signal.

14. The amplification device of claim 13 wherein the temperature differential sensing circuit further comprises:
   the first transistor having a first base terminal wherein adjusting a voltage to the first base terminal adjust the reference signal; and
   the second transistor having a second base terminal wherein adjusting a voltage to the second base terminal adjusts the sensing component signal.

15. A method of reducing a thermal memory effect of an amplification circuit coupled to biasing circuitry, the method comprising:
   detecting a temperature difference between a first temperature associated with the amplification circuit and a reference temperature using a mirror circuit; and
   adjusting a bias level of a biasing signal output from the biasing circuitry to the amplification circuit in accordance with the temperature difference.

16. The method of claim 15 wherein the reference temperature is associated with the biasing circuitry.

17. The method of claim 15 wherein detecting the temperature difference between the first temperature associated with the amplification circuit and the reference temperature, comprises:
   operating an amplification temperature sensing component thermally associated with the amplification circuit in accordance with the first temperature;
   operating a reference temperature sensing component in accordance with the reference temperature;
   detecting the temperature difference by sensing when the amplification temperature sensing component is operating differently than the reference temperature sensing component.

18. The method of claim 15 wherein adjusting the bias level of the biasing signal that is output from the biasing circuitry to the amplification circuit in accordance with the temperature difference, comprises:
   generating a reference signal having a signal level related to the reference temperature; and
   generating the bias level adjustment signal related to the first temperature wherein the bias level adjustment signal adjusts the bias level of the biasing signal when a signal level of the bias level adjustment signal is substantially different that the signal level of the reference signal.

19. An amplification device capable of reducing a thermal memory effect, comprising:
   an amplification circuit operable to receive an input signal and generate an amplified output signal from the input signal;
   a biasing circuit coupled to the amplification circuit and operable to apply a bias level to the input signal wherein the bias level is associated with a quiescent operating level of the amplified output signal;
   a temperature differential sensing circuit comprising a mirror circuit and coupled to the biasing circuit, the temperature differential sensing circuit being configured to sense a temperature difference between a first temperature associated with the amplification circuit and a reference temperature and produce a bias level adjustment signal based on the temperature difference wherein the biasing circuit is responsive to adjust the bias level applied to the input signal in response to the bias level adjustment signal.

20. The amplification device of claim 19 further comprising a plurality of amplification circuits including the amplification circuit, each of the plurality of amplification circuits being operable to receive a respective input signal and generate a respective amplified output signal from the respective input signal and each of the plurality of amplification circuits being coupled to the biasing circuitry such that the biasing circuitry applies a bias level to each of the respective input signals.

* * * * *